(12) United States Patent
Kimura

(10) Patent No.: US 7,271,536 B2
(45) Date of Patent: Sep. 18, 2007

(54) ORGANIC EL PANEL

(75) Inventor: Hiroshi Kimura, Matsumoto (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 11/625,848

(22) Filed: Jan. 23, 2007

(65) Prior Publication Data

US 2007/0152571 A1   Jul. 5, 2007

Related U.S. Application Data

(63) Continuation of application No. PCT/JP2005/014094, filed on Aug. 2, 2005.

(30) Foreign Application Priority Data

Aug. 4, 2004   (JP)  .............................. 2004-228320

(51) Int. Cl.
*H01J 1/62*   (2006.01)
(52) U.S. Cl. ...................................... 313/504; 313/506
(58) Field of Classification Search ................ 313/498, 313/502–506, 509
See application file for complete search history.

(56) References Cited

FOREIGN PATENT DOCUMENTS

| JP | 05-036475 A | 2/1993 |
|---|---|---|
| JP | 05-119306 A | 5/1993 |
| JP | 05-134112 A | 5/1993 |
| JP | 06-300910 A | 10/1994 |
| JP | 07-048424 A | 2/1995 |
| JP | 07-104114 A | 4/1995 |
| JP | 07-128519 A | 5/1995 |
| JP | 07-218717 A | 8/1995 |
| JP | 07-306311 A | 11/1995 |
| JP | 08-027934 A | 1/1996 |
| JP | 08-279394 A | 10/1996 |
| JP | 09-330793 A | 12/1997 |
| JP | 10-270173 A | 10/1998 |
| JP | 11-273869 A | 10/1999 |
| JP | 2003-017263 A | 1/2003 |
| JP | 2003-144830 A | 5/2003 |
| JP | 2003-178875 A | 6/2003 |

OTHER PUBLICATIONS

C.W. Tang et al., "Organic Electroluminescent Diodes", Appl. Phys. Lett, 51, Sep. 1987, pp. 913-915, 1987 American Institue of Physics.

*Primary Examiner*—Vip Patel
(74) *Attorney, Agent, or Firm*—Rossi, Kimms & McDowell LLP

(57) ABSTRACT

An organic EL panel is discloses that includes a substrate and a segment display section provided on the substrate. The segment display section includes an organic EL light emitting section and plural kinds of color modulating sections. The organic EL light emitting section has a single reflective electrode, an organic EL layer, a shadow mask having a plurality of openings, and a single transparent electrode. The plural kinds of color modulating sections are arranged adjacent to the substrate, and each of the plural kinds of color modulating sections is divided into a plurality of subsections. Each of the plural kinds of color modulating sections can be composed of either a color filter layer or a laminated structure of a color filter layer and a color conversion layer. Emitting color of the segment display section can be adjusted by the positions and number of the openings arranged in the shadow mask.

6 Claims, 4 Drawing Sheets

ORGANIC EL PANEL

CROSS REFERENCE TO RELATED APPLICATIONS

This application is a continuing application based on International Application no. PCT/JP2005/014094, filed on Aug. 2, 2005, which claims priority from Japanese application Serial No. JP 2004-228320 filed on Aug. 4, 2004, the contents of which are incorporated herein in their entirety.

BACKGROUND OF THE INVENTION

A. Field of the Invention

The present invention relates to an organic EL panel, in particular, an organic EL panel performing segment display in which the contrast between bright and dark states of the panel is improved.

B. Description of the Related Art

Since C. W. Tang et al. of Eastman Kodak Company announced an organic EL panel having a two layer structure and exhibiting high efficiency in 1987, various types of organic EL devices have been developed, and some of them began to be practically applied (C. W. Tang and S. A. van Slike, *Appl. Phys. Lett.* 51, 913 (1987)).

Methods for full color display have been studied: a device with plural types of organic EL light emitting elements each type emitting different color light are arranged on a substrate (so-called patterned RGB method); a device using a color conversion method, in which wavelength distribution of a back light is converted (hereinafter referred to as "CCM method"); and a device using a color filter method, in which light emission from a back light is irradiated through color filters. A color conversion layer and a color filter layer can be deposited without metallic mask and patterned as desired by means of a photo process. Therefore, the CCM method and the color filter method are advantageous for achieving a large area and high definition display.

Color panels capable of multicolor display are being developed today in organic EL panels. In some cases using a color panel there can be a section (for example an icon section or a time indicating section) in a panel that needs continuous lighting. However, the continuously lit section, in which current is running continuously, may cause problems of image sticking or degradation of brightness. To address this problem, a means is occasionally employed in which the continuously lit section is a segment displayed by static driving instead of by matrix driving. An organic EL panel 500 can be formed as shown in FIG. 1, comprising variable display section 600 that is matrix driven and segment display sections 650 that are statically driven.

In a segment display section formed using a CCM method or a color filter method, if the whole segment display section is composed of a single CCM or color filter, the opening becomes large. External light incident on the large opening is reflected from the reflective electrode and irradiated outwardly. As a result, the segment display section looks like it is emitting light even in the dark state (in the unlighted period), causing a problem of decrease of the contrast ratio between bright and dark periods (see FIG. 2). In the structure of FIG. 2, a color modulating section 20 composed of a color filter and a color conversion layer is formed on substrate 10. An organic EL device comprising transparent electrode 60, organic EL layer 80, and reflective electrode 90 is provided over overcoat layer 40 and passivation layer 50. Of external light 100 incident to the substrate, the component transmitting the color filter (that is light 110 in a color to be displayed by the segment display section) transmits through the color conversion layer and the subsequent layers, is reflected from the reflective electrode, transmits again through the color filter, and emits outwardly (reflection light 120). In addition, scattering light 130 scattered in the layers through which light 110 transmits is also emitted. Reflection light 120 and scattering light 130 have the wavelength component transmitted through the color filter. This means that, of incident light 100, only the light in the color to be displayed by the segment display is emitted. As a result, the contrast ratio decreases.

To address the degradation of contrast ratio, it has been proposed to paste a circular polarization film on the panel surface (Japanese Unexamined Patent Application Publication No. 2003-144830). However, the circular polarization film, though effective for reducing reflected light, cuts a part of the light emitted from the organic EL device in the bright period. So, the circular polarization film has a drawback causing degradation of emission efficiency of the panel as a whole. The decrease of emission efficiency is unfavorable because it results in increased power consumption, and a shortening of degradation lifetime of brightness of the organic EL device.

A method is therefore demanded in a segment display section employing a CCM method or a color filter method that prevents decrease of the contrast ratio due to reflection of external light and decrease of the emission efficiency in the bright period, which occurs in the use of a circular polarization film. The present invention is directed to overcoming or at least reducing the effects of one or more of the problems set forth above.

SUMMARY OF THE INVENTION

In order to solve these and other problems, an organic EL panel according to the present invention comprises a substrate and a segment display section provided on the substrate. The segment display section comprises an organic EL light emitting section and plural kinds of color modulating sections. The organic EL light emitting section comprises a single reflective electrode, an organic EL layer, a shadow mask having a plurality of openings, and a single transparent electrode. The plural kinds of color modulating sections are arranged adjacent to the substrate, and each of the plural kinds of color modulating sections is divided into a plurality of subsections. Each of the plural kinds of color modulating sections can be composed of a color filter layer, or a laminated structure of a color filter layer and a color conversion layer. Emitting color of the segment display section can be adjusted by positions and number of the openings arranged in the shadow mask. The organic EL panel according to the invention can further comprise a variable display section comprising at least a second reflective electrode consisting of a plurality of electrode elements, a second organic light emitting layer, and a second transparent electrode consisting of a plurality of electrode elements. The plural kinds of color modulating sections are preferably so provided that the kinds and proportion thereof allow emission of white light. The plural kinds of color modulating sections preferably comprises a red color modulating section, a green color modulating section, and a blue color modulating section.

An organic EL panel constituted as described above reflects the incident light as achromatic light in white or gray color. So, the segment display section does not look like it is emitting and suppresses the degradation of contrast ratio. An organic EL panel of the invention does not use a layer that cuts the light from the organic EL device as the circular polarization film does. Therefore, high emission efficiency can be maintained.

BRIEF DESCRIPTION OF THE DRAWINGS

The foregoing advantages and features of the invention will become apparent upon reference to the following detailed description and the accompanying drawings, of which:

FIGS. 3(a) and 3(b) are sectional views of an organic EL panel of the invention having a green segment display section, in which FIG. 3(a) illustrates reflection of external light in the dark period, and FIG. 3(b) illustrates light emitting state in the bright period;

FIGS. 4(a) and 4(b) are transverse sectional views of an organic EL panel of the invention having a green segment display section, in which FIG. 4(a) is a transverse sectional view taken along the line 4a-4a in FIG. 3(a) showing openings in a shadow mask, and FIG. 4(b) is a transverse sectional view taken along the line 4b-4b in FIG. 3(a) showing color modulating sections; and FIGS. 5(a) and 5(b) are sectional views of an organic EL panel of the invention having a white segment display section, in which FIG. 5(a) illustrates reflection of external light in the dark period, and FIG. 5(b) illustrates light emitting state in the bright period.

DETAILED DESCRIPTION OF SPECIFIC EMBODIMENTS

Figure 3A:
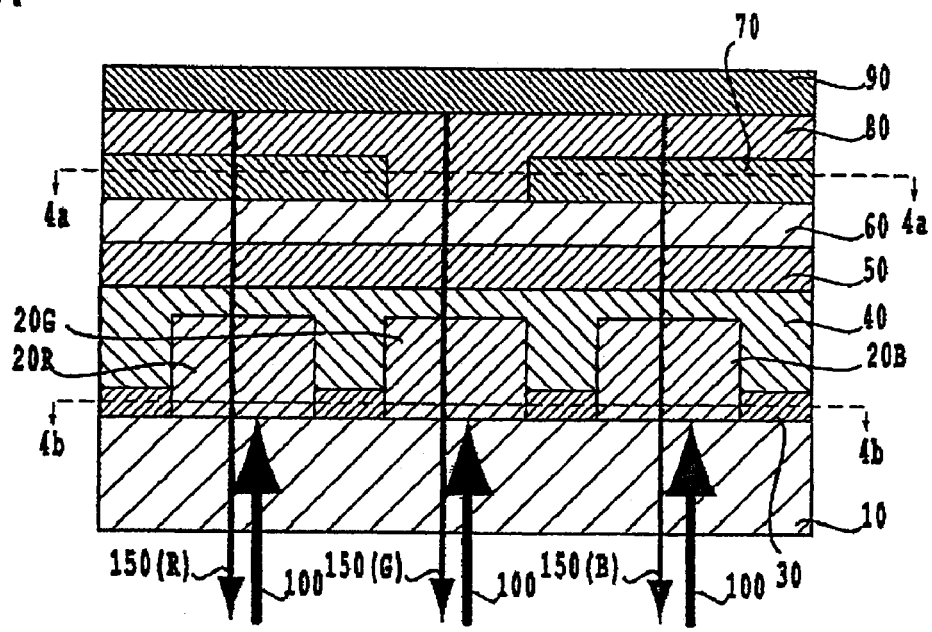
Figure 3B:
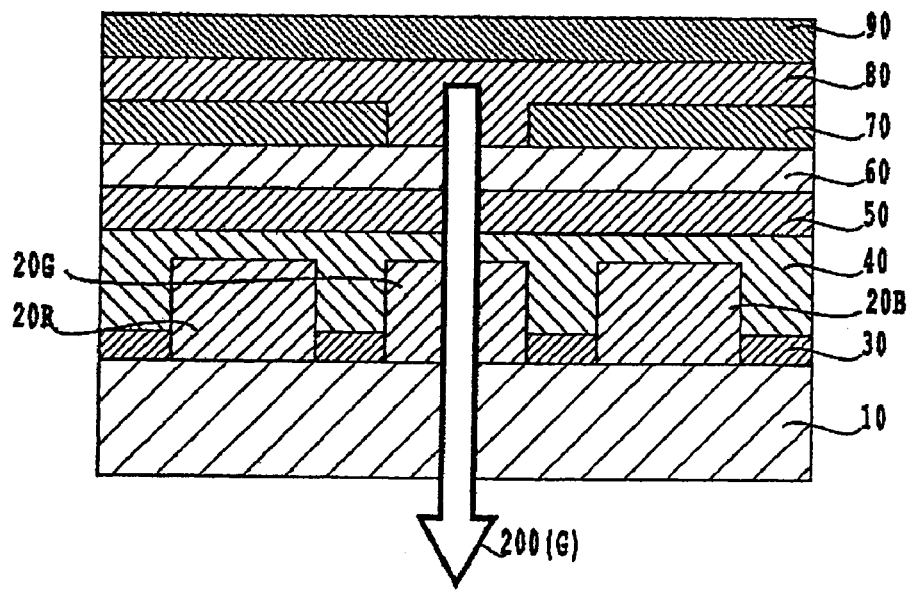

Now, the present invention will be described with reference to an example of an organic EL panel, as shown in FIGS. 3(a) and 3(b) having a segment display section that emits green light. An organic EL panel of the invention comprises substrate 10 and a segment display section provided on substrate 10. The segment display section includes an organic EL light emitting section and plural kinds of color modulating sections 20. The organic EL light emitting section comprises at least single reflective electrode 90, organic EL layer 80, shadow mask 70 having a plurality of openings, and single transparent electrode 60. The plural kinds of color modulating sections 20 are arranged adjacent to the substrate, and each of the color modulating sections is divided into a plurality of subsections.

Substrate 10 needs to be transparent to visible light (wavelength about 400 to 700 nm), preferably to the light converted by color modulating section 20. Substrate 10 needs to withstand the conditions (solvents, temperatures, etc.) used in the processes of forming color modulating sections 20 and the other layers (described later) formed as required. It is desired that substrate 10 exhibit dimensional stability. Favorable materials for substrate 10 include glass and resins such as poly(ethylene terephthalate) and poly (methyl methacrylate). Particularly preferable are borosilicate glass and blue plate glass.

Plural kinds of color modulating sections 20 are provided on substrate 10. Each of color modulating sections 20 can be composed of a color filter layer, a color conversion layer, or a laminate consisting of a color filter layer and a color conversion layer. The example of FIGS. 3(a) and 3(b) is provided with a blue color modulating section 20B consisting of a color filter, and green color modulating section 20G and red color modulating section 20R, each of the two sections 20G and 20R being composed of a laminate consisting of a color filter layer and a color conversion layer. The plural kinds of color modulating sections 20 have a combination of kinds and proportion of arrangement so as to emit achromatic light (preferably white light). For example, blue, green and red color modulating sections 20 are arranged in the same number as shown in FIGS. 3(a) and 3(b), or blue-green and yellow color modulating sections 20 are arranged in the same number. The proportion of arrangement can be adjusted considering conversion efficiency for each color modulating section used.

A color filter layer transmits only the specific light in a desired wavelength region. A color filter layer, when a laminated structure is taken together with a color conversion layer, is effective to improve color purity of the light after wavelength distribution conversion by the color conversion layer. A color filter layer can be formed using a commercially available color filter material for liquid crystals (for example, Color Mosaic manufactured by Fujifilm Arch Co., Ltd.). A color filter layer has a thickness in the range of 1 to 2.5 µm, preferably in the range of 1 to 1.5 µm, depending on the content of dyestuff.

A color conversion layer is composed of color conversion material and matrix resin. A color conversion material conducts wavelength distribution conversion of the incident light and emits light in a different wavelength region. Preferably, the color conversion material conducts wavelength distribution conversion on near ultraviolet light or blue to blue-green color light and emits light in the desired wavelength region (for example, blue color, green color or red color). In normal cases, the color conversion layer contains a color conversion material in an amount of at least 0.2 µmol, preferably in the range of 1 to 20 µmol, more preferably in the range of 3 to 15 µmol with respect to 1 g of matrix resin. The color conversion layer has a thickness normally at least 5 µm, preferably in the range of 7 to 15 µm.

Color conversion materials that absorb light in blue to blue-green color region and emit red color light include, for example, rhodamine dyes such as rhodamine B, rhodamine 6G, rhodamine 3B, rhodamine 101, rhodamine 110, sulforhodamine, basic violet 11, and basic red 2; cyanine dyes; pyridine dyes such as 1-ethyl-2-[4-(p-dimethylamino-phenyl)-1,3-butadienyl]-pyridinium perchlorate (pyridine 1); and oxazine dyes.

Color conversion materials that absorb light in blue to blue-green color region and emit green color light include, for example, coumarin dyes such as 3-(2'-benzothiazolyl)-7-diethylamino-coumarin (coumarin 6), 3-(2'-benzoimidazolyl)-7-diethyamino-coumarin (coumarin 7), 3-(2'-N-methylbenzoimidazolyl)-7-diethylamino-coumarin (coumarin 30), and 2,3,5,6-1H,4H-tetrahydro-8-trifluoromethyl-quinolidine (9,9a,1-gh) coumarin (coumarin 153); dyestuffs in a class of coumarin dye coumarin derivatives such as basic yellow 51; and naphthalimido dyes such as solvent yellow 11 and solvent yellow 116.

Fluorescent dyes that absorb light in near ultraviolet to visible light region and emit blue light include, for example, coumarin dyes such as coumarin 466, coumarin 47, coumarin 2, and coumarin 102.

Color modulating section 20 can be formed by first applying the materials for each layer by means of a spin coating method, a roll coating method, a casting method, or a dip coating method, and then patterning by means of a photolithography method. In the case of forming a variable display section for matrix driving together on the same substrate, the color modulating section of the segment display section and the variable display section can be fabricated particularly effectively in the same process without changing a photo mask.

Black mask 30, planarizing layer 40, and passivation layer 50 can be formed as necessary. Black mask 30 is a black layer provided in the area between color modulating sections 20. Black mask 30 is effective to limit external incident light into the device and improve the contrast ratio. The black mask can be formed using a commercially available material for liquid crystals.

Planarizing layer 40 planarizes the irregularities that are formed by color modulating sections 20 and the black mask, if provided. Useful organic materials for forming the planarizing layer include, for example, imide-modified silicone resin (Japanese Unexamined Patent Application Publication Nos. H5-134112, H7-218717, and H7-306311), inorganic compounds of metal ($TiO_2$, $Al_2O_3$, $SiO_2$ or the like) dispersed in acrylic resin, polyimide resin, or silicone resin (Japanese Unexamined Patent Application Publication Nos. H5-119306 and H7-104114), epoxy-modified acrylate resin, ultraviolet-light-setting resins of acrylate monomer/oligomer/polymer containing reactive vinyl group (Japanese Unexamined Patent Application Publication No. H7-48424), resist resin (Japanese Unexamined Patent Application Publication Nos. H8-279394, H6-300910, H7-128519, and H9-330793), inorganic compounds (that can be formed by a sol-gel method; Japanese Unexamined Patent Application Publication No. H8-27934), and photochemically-setting and/or thermally-setting resins such as fluorine-containing resins (Japanese Unexamined Patent Application Publication Nos. H9-330793 and H5-36475). Planarizing layer 40 can be formed of these materials by means of any method known in the art selected from dry methods (including a sputtering method, an evaporation method, a CVD method and the like) and wet methods (including a spin-coating method, a roll-coating method, a casing method, a dip-coating method and the like).

A material for passivation layer 50 is preferably selected from materials that exhibit high transparency to visible light (a transmittance at least 50% in the range of 400 to 700 nm), a Tg of at least 100° C., a pencil hardness of 2H or harder, and don't deteriorate the functions of the organic light emitting section formed on the passivation layer by intercepting gases and moisture. Preferred materials for forming passivation layer 50 can be selected from inorganic oxides and inorganic nitrides including $SiO_x$, $SiN_x$, $SiN_xO_y$, $AlO_x$, $TiO_x$, $TaO_x$, and $ZnO_x$. Passivation layer 50 can be a single layer made of the inorganic oxide or inorganic nitride, or a laminated structure consisting of those layers. Passivation layer 50 can be formed by means of any method known in the art selected from dry methods (including a sputtering method, an evaporation method, a CVD method and the like) and wet methods (including a spin-coating method, a roll-coating method, a casing method, a dip-coating method, a sol-gel method, and the like).

Transparent electrode 60 can be formed by laminating a conductive metal oxide selected from $SnO_2$, $In_2O_3$, ITO, IZO, and ZnO:Al by means of a sputtering method. When transparent electrode 60 is used for a cathode, a layer composing organic EL layer 80 and contacting transparent electrode 60 is preferably formed as an electron injection layer, so as to enhance electron injection efficiency. Transparent electrode 60 preferably exhibits a transmissivity of at least 50%, more preferably at least 85% to the light in the wavelength range of 400 to 800 nm. Thickness of transparent electrode 60 is normally at least 50 nm, preferably in the range of 50 nm to 1 μm, more preferably in the range of 100 to 300 nm.

Reflective electrode 90 is preferably formed by using a high reflectivity metal, an amorphous alloy, or a microcrystalline alloy. The high reflectivity metal can be selected from Al, Ag, Mo, W, Ni, and Cr. The high reflectivity amorphous alloy can be selected from NiP, NiB, CrP, and CrB. The high reflectivity microcrystalline alloy can be NiAl, for example. The reflective electrode 90 can be used either as an anode or a cathode. When the reflective electrode 90 is used as an anode, a conductive metal oxide such as $SnO_2$, $In_2O_3$, ITO, IZO, or ZnO:Al can be laminated on the surface contacting the organic EL layer 80 to enhance hole injection efficiency into organic EL layer 80. When reflective electrode 90 is used for a cathode, a layer composing organic EL layer 80 and contacting transparent electrode 60 is preferably formed as an electron injection layer, so as to enhance electron injection efficiency.

Transparent electrode 60 and reflective electrode 90 in the invention are formed as a single structure (one piece) having a shape corresponding to the segment display section and statically driven. The static drive can light the whole segment display section at once. Consequently, brighter display can be achieved with lower power consumption than passive matrix driving, the latter being affected by a duty factor. Fabrication of transparent electrode 60 and reflective electrode 90, connection to external power supply and control can be carried out by methods known in the art.

Organic EL layer 80 comprises at least an organic light emitting layer, and as necessary, a hole injection layer, a hole transport layer, an electron transport layer, and/or an electron injection layer. Each layer is formed having a sufficient thickness for performing desired characteristics for the layer. A specific layer structure selected from the following can be employed.

(1) Organic light emitting layer
(2) Hole injection layer/Organic light emitting layer
(3) Organic light emitting layer/Electron injection layer
(4) Hole injection layer/Organic light emitting layer/Electron injection layer
(5) Hole transport layer/Organic light emitting layer/Electron injection layer
(6) Hole injection layer/Hole transport layer/Organic light emitting layer/Electron injection layer
(7) Hole injection layer/Hole transport layer/Organic light emitting layer/Electron transport layer/Electron injection layer (Here, an electrode working as an anode is connected to the left side, and an electrode working as a cathode is connected to right side of each list of layers.)

Materials of the organic light emitting layer can be selected from known materials. To obtain the light emission in blue to blue green color, the organic light emitting layer contains, for example, a condensed aromatic ring compound, condensed ring compound, a metal complex, styrylbenzene compound, a porphyrin compound, a fluorescent brightening agent such as benzothiazole, benzoimidazole, or benzoxazole, or an aromatic dimethylidine compound. An organic light emitting layer emitting light in various wavelength regions can be formed by adding dopants into a host compound. The host compound can be selected from, for example, distyryl arylene compound (for example, IDE-120, a product of Idemitsu Kosan Co., Ltd.), N,N'-ditolyl-N,N'-diphenyl-biphenyl amine (TPD), and aluminum tris(8-quinolinolate) ($Alq_3$). The dopant can be selected from, perylene (blue-violet color), coumarin 6 (blue color), quinacridone compound (blue-green to green color), rubrene (yellow color), 4-dicyanomethylene-2-(p-dimethylamino styryl)-6-methyl-4H-pyrane (DCM, red color), and platinum octaethyl porphyrin complex (PtOEP, red color).

A material for the hole injection layer can be selected from phthalocyanines (such as CuPc) and indanthrene compounds. A material for the hole transport layer can be selected from the materials having partial structures of triaryl amine, carbazole, or oxadiazole (for example, TPD, α-NPD, PBD, and m-MTDATA).

A material for the electron transport layer can be selected from oxadiazole derivatives such as PBD and TPOB, triazole derivatives such as TAZ, triazine derivatives, phenylquinoxalines, thiophene derivatives such as BMB-2T and BMB-3T, and aluminum complex such as $Alq_3$. The electron injection layer can be a thin film (film thickness of at most 10 nm) of an electron injective material selected from alkali metals, alkaline earth metals, alloy of these metals, and fluorides of an alkali metal. The material of the electron injection layer can also be an aluminum quinolinol complex doped with an alkali metal or an alkaline earth metal.

The layers composing organic EL layer 80 can be formed by any method known in the art such as evaporation (resistance heating or electron beam heating).

Shadow mask 70 is formed between transparent electrode 60 and organic EL layer 80, and has a plurality of openings. Each opening is provided at a position corresponding to one of color modulating sections 20. Shadow mask 70 can be formed of organic or inorganic insulator material. The material for shadow mask 70 can be selected from SM1, which is a commercially available organic material manufactured by JSR Co., Ltd., and inorganic oxides and inorganic nitrides including $SiO_x$, $SiN_x$, $SiN_xO_y$, $AlO_x$, $TiO_x$, and $TaO_x$. Although shadow mask 70 can have any color, it is preferably transparent, as described later.

The shadow mask has a film thickness in the range of 0.1 to 5 μm, preferably in the range of 0.2 to 1 μm, and is formed with a taper angle (an angle between the surface of the transparent electrode 60 and the side plane of the shadow mask 70) of 1° to 45°, preferably in the range of 5° to 30°. Shadow mask 70 desirably exhibits transmissivity to visible light from 70 to 100%. Shadow mask 70 can be formed by means of any method known in the art selected from dry methods (including a sputtering method, an evaporation method, a CVD method and the like) and wet methods (including a spin-coating method, a roll-coating method, a casting method, a dip-coating method, a sol-gel method, and the like). The tapered shape can be formed by a method known in the art such as an isotropic etching method.

Figure 4A:
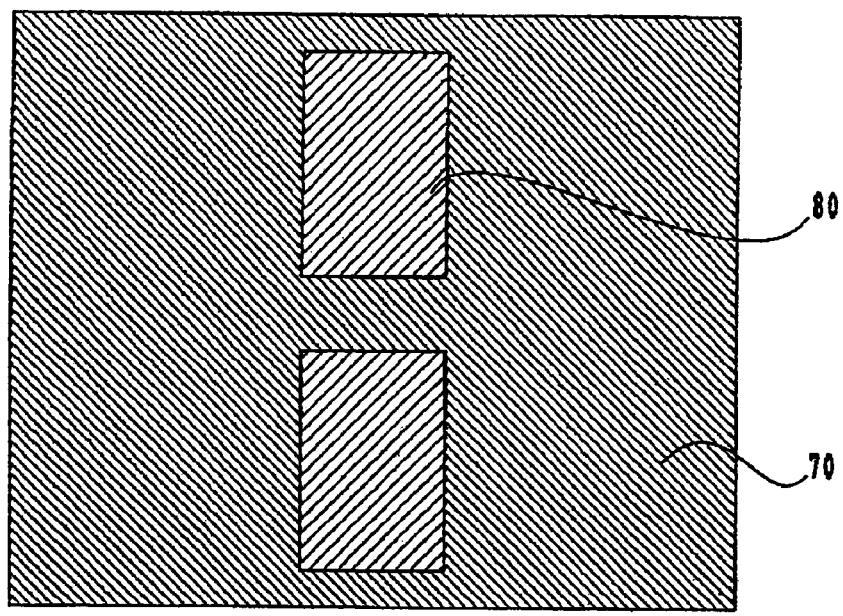
Figure 4B:
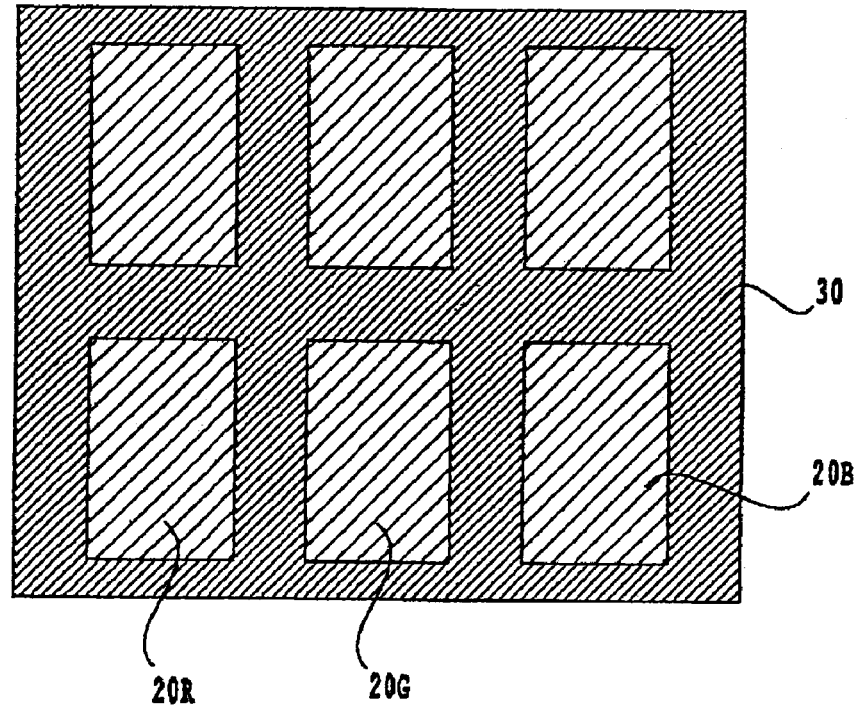

FIG. 3(a) shows an organic EL panel having a segment display section emitting green light to which external light 100 is incident. Shadow mask 70 in this example is provided with an opening at the position corresponding to green color modulating section 20G, as shown in FIGS. 4(a) and 4(b). Incident external light 100 passes through color modulating sections 20R, 20G, and 20B for the colors red, green and blue, and is changed to the colors of the color filter of the color modulating sections and enters into the internal layers of the panel. Then, the light is reflected at reflective electrode 90 or scattered within the panel, and again passes through color modulating sections 20R, 20G, and 20B, emitting outwardly (emitting light is designated as 150(R), 150(G), and 150(B)). Since emitting light 150 is weak in brightness, it actually looks gray in color. Moreover, black mask 30 around color modulating sections 20 does not reflect light, and lowers the brightness at the front panel. As a result, emitted light 150 appears dark gray.

FIG. 3(b) shows the organic EL panel in the lit state. Shadow mask 70, being made of an insulator material, inhibits injection of carriers (holes or electrons) into the region of organic EL layer 80 on which shadow mask 70 is provided. Consequently, the organic EL layer in the region with shadow mask 70 does not emit light, and only the region of organic EL layer 80 corresponding to green color modulating section 20G emits light 200G. As a result, the segment display section appears green in color. The organic EL panel of the invention, which does not use a circular polarization plate, effectively irradiates the light from organic EL layer 80 outwardly. This structure, being driven in a static driving mode instead of in a matrix driving mode, can drive organic EL layer 80 at the places in the segment displaying section corresponding to green color modulating sections 20G to emit light at the same time. In the case of passive matrix driving, the emitting time of each pixel is 1/(number of scanning lines) of the total emission time. Accordingly, each pixel needs to emit light with higher luminance for achieving desired brightness in the whole surface of the segment display section. In contrast, in the segment display in the panel of the invention, all pixels can be lit at the same time over the whole emission time. Therefore, desired brightness of the segment display section can be achieved by lower luminance of lighting. This is also advantageous for elongated life of an organic EL panel.

The structure of FIGS. 3(a) and 3(b) has an opening in the shadow mask 70 at the position corresponding to green color modulating section 20G to obtain green light emission of the segment display section. However, emission of a color of another color modulating section such as blue or red color can be obtained by changing the position of the openings in shadow mask 70. Further, by providing the openings in shadow mask 70 at the positions corresponding to plural kinds of color modulating sections, the color of emission from the segment display section can be made to be a mixed color by additive mixing of colors from the plural kinds of color modulating sections. Moreover, light emission in any desired color can be obtained by adjusting positions of openings (to be provided corresponding to which kind of the plural kinds of color modulating sections), and number of openings (proportion of openings with respect to total number of one kind of color modulating sections).

Figure 5A:
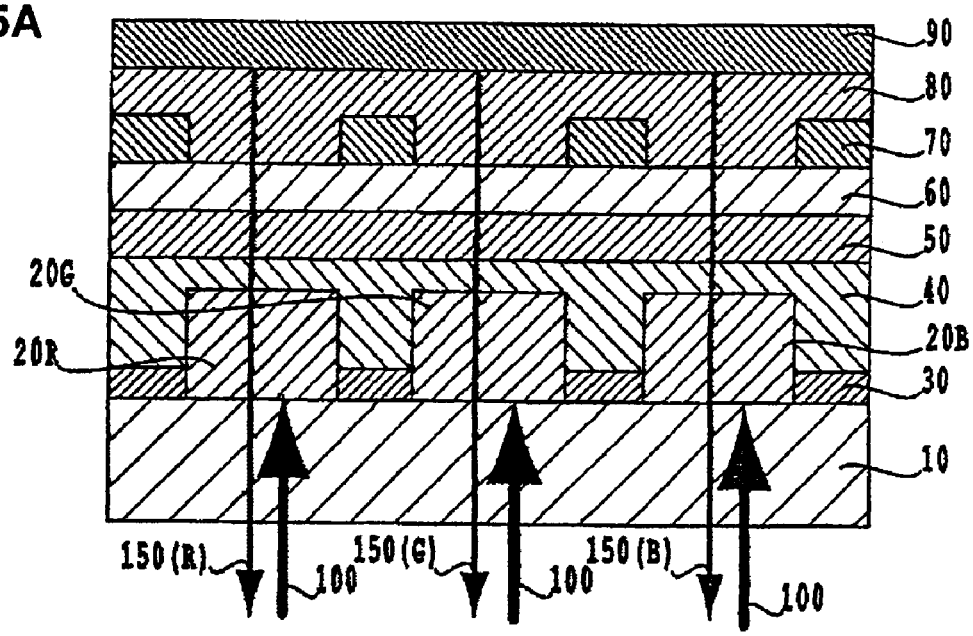
Figure 5B:
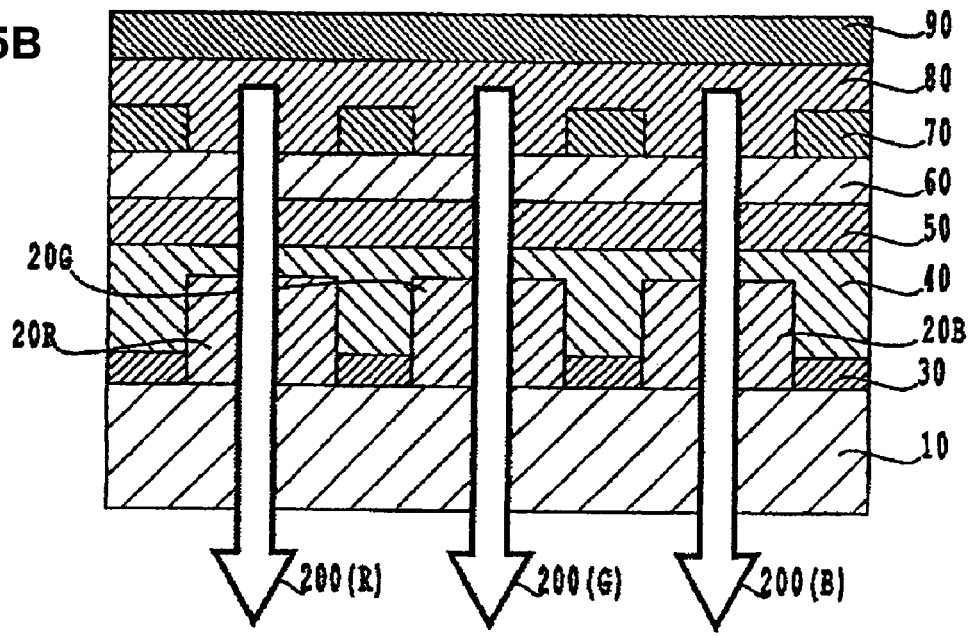

FIGS. 5(a) and 5(b) show an example of the structure of an organic EL panel having a segment display section emitting white light. The structure of FIGS. 5(a) and 5(b) differs from the structure of FIGS. 3(a) and 3(b) in that shadow mask 70 has openings at the positions corresponding to every color modulating section 20. When external light 100 enters the organic EL panel as shown in FIG. 5(a), in the same way as in the case of FIG. 3(a), the external light becomes three types of rays in the color of the color filters of color modulating sections 20 and passes through the layers within the panel. Then, the light is reflected from the reflective electrode 90 and irradiated outwardly as an achromatic light (white or gray) with lower luminance.

FIG. 5(b) illustrates a light emitting state of the organic EL panel. In this structure, organic EL layer 80 at all positions corresponding to color modulating sections 20R, 20G, and 20B emits light. As a result, the colors of the emitted light of 200R, 200G, and 200B are mixed in an additive mixing mode and the segment display section appears white. Just the same as the structure of FIGS. 3(a) and 3(b), the effects of not employing a circular polarizing plate and employing static driving are obtained as well.

Thus, organic EL layer 80 emits light effectively, and long life of the organic EL panel can be achieved.

Figure 1:
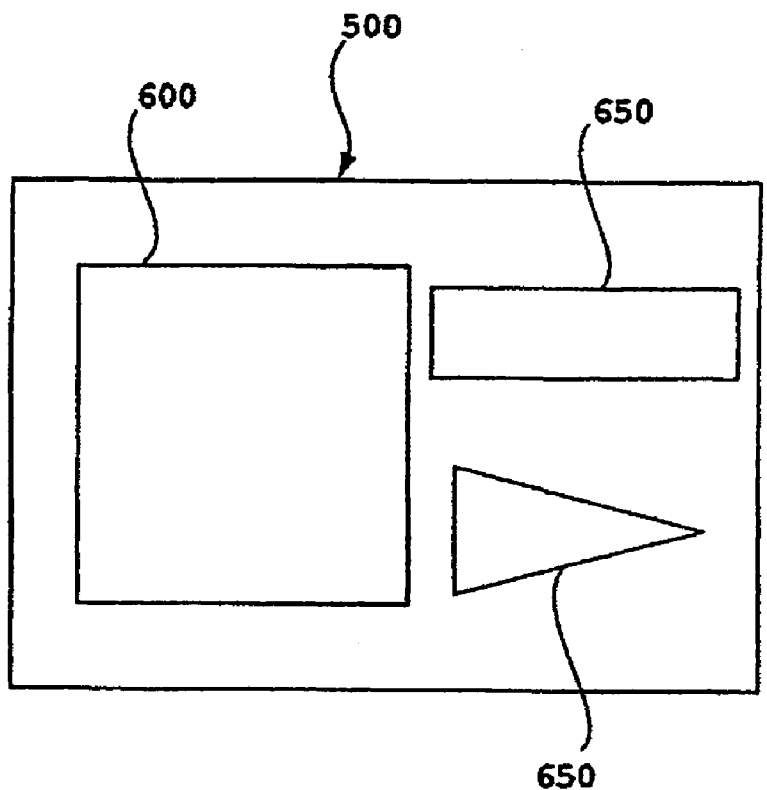
FIG. 1 is a conceptual plan view of an organic EL panel having segment display sections and a variable display section.
Figure 2:
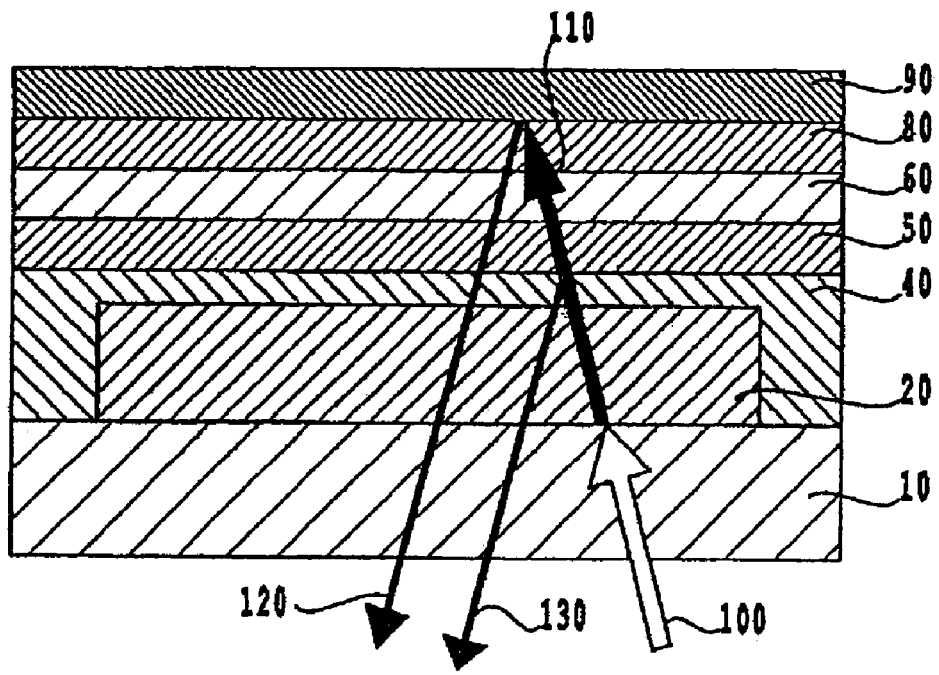
FIG. 2 is a sectional view illustrating a light emission mechanism in the dark period of a segment display section of a conventional structure.

Organic EL panel 500 of the invention can comprise, as shown in FIG. 1, variable display section 600 driven in matrix driving mode in addition to segment display sections 650 driven in static driving mode. In that case, the dimensions and arrangement pitches of each color modulating section 20 are preferably the same over the segment display sections and the variable display section, and, more preferably, meet the demand of the variable display section. The variable display section comprises second transparent electrode, second organic EL layer, and second reflective electrode, which are separate from the transparent electrode, the organic EL layer, and the reflective electrode of the segment display sections. The second transparent electrode, the second organic EL layer, and the second reflective electrode can be formed of the same materials as the materials of the transparent electrode, the organic EL layer, and the reflective electrode of the segment display sections, respectively.

The second transparent electrode, in the case of passive matrix driving, can be formed of a plurality of electrode elements with a stripe shape extending in one direction. In the case of active matrix driving, the second transparent electrode can consist of a plurality of electrode elements each corresponding to a pixel or subpixel and connecting to a switching element (for example TFT) in one-to-one corresponding manner.

The second reflective electrode of the variable display section, in the case of passive matrix driving, can consist of a plurality of electrode elements having a stripe shape and extending in a direction crossing stripes of the second transparent electrode. Light emitting points of organic EL layer 80 are located at the positions at which the stripe of the second reflective electrode and the stripe of the second transparent electrode cross each other. The light emitting points correspond to the positions of the color modulating sections. In the case of active matrix driving, the second reflective electrode can be a single electrode spreading over the whole surface of the variable display section.

EXAMPLE 1

An organic EL panel was manufactured having a variable display section with 10 mm square for passive matrix driving mode and a green color emission segment display section with 2 mm square for static driving mode. The dimensions of each subpixel were 100 μm×300 μm, and the filling factor was 70%. Black mask 30 was formed over glass substrate 10 except the area of the color modulating section. Then, color modulating sections 20B, 20G, and 20R were formed in both the variable display section and the segment display section. Red and green color modulating sections 20R and 20G had a lamination structure consisting of a color filter layer and a color conversion layer; blue color modulating section 20B was composed of a color filter layer alone. Then, planarizing layer 40 and passivation layer 50 were sequentially formed.

On passivation layer 50, an IZO film was deposited by a sputtering method and patterned as required, to form transparent electrode 60. The patterned transparent electrode 60 was a pattern of stripes 100 μm wide extending in one direction in the variable display section, and a single electrode in the segment display section. Then, SM1 (a product of JSR Co., Ltd.) was deposited and patterned to form shadow mask 70 with a thickness of 1 μm having an opening corresponding to green color modulating section 20G. In the variable display section, a plurality of separation walls for reflective electrode were provided having a reverse-tapered cross-section and extending in the direction perpendicular to the direction of the stripes of the transparent electrode.

The thus formed lamination structure was transferred to a vacuum evaporation apparatus, and organic EL layer 80 and reflective electrode 90 were sequentially formed by means of an evaporation method without breaking the vacuum. Organic EL layer 80 had a lamination structure consisting of a hole injection layer, a hole transport layer, an organic light emitting layer (host material: IDE-140 and dopant material: IDE-102, manufactured by Idemitsu Kosan Co., Ltd.), an electron transport layer, and an electron injection layer. Reflective electrode 90 was formed of aluminum. In the variable display section, the formed reflective electrode 90 consisted of a plurality of stripes each 100 μm wide that were separated by separation walls for reflective electrode from each other and extended in the direction perpendicular to the stripes of transparent electrode 60. In the segment display section, the reflective electrode was a single electrode corresponding to the shape of the segment display section.

Finally, the thus formed laminate was transferred to a globe box and bonded with a sealing glass having desiccant agent applied thereon, in the side of the functional elements of the glass substrate. Thus, an organic EL panel was manufactured.

COMPARATIVE EXAMPLE 1

An organic EL panel was manufactured repeating the procedure in Example 1 except that blue and red color modulating sections 20B and 20R were not formed in the segment display section, and only green color modulating section 20G 2 mm square was formed.

Evaluation

Contrast ratios between bright and dark periods were compared between the segment display sections of the organic EL panels of Example 1 and Comparative Example 1. The values of brightness on the panel surface were measured in the dark period and the bright period to calculate contrast ratios when illuminating white light of 1,000 lux. The contrast ratio on the segment display section in the organic EL panel of Example 1 was 100:1, while the contrast ratio on the segment display section of Comparative Example 1 was 2:1, hardly showing any contrast.

This result demonstrated that a segment display section comprising plural kinds of color modulating sections and a shadow mask improves a contrast ratio and exhibits high quality display. While a green color segment display section was studied in Example 1, the same results have been obtained for blue and red color display. Further, segment display in various colors other than primary colors are possible by adjusting arrangement and size of the openings in the shadow mask. Moreover, while the Example 1 was an example using the color modulating sections of three primary colors red, green, and blue colors, the same effect has been obtained using color modulating sections of two colors blue-green color and yellow color.

INDUSTRIAL APPLICABILITY

The present invention can be applied to organic EL panels that need high contrast and high emission efficiency in the existence of external light incident to the organic EL panel.

Thus, an organic EL panel has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

| Explanation of Letters or Numerals | |
|---|---|
| 10: | substrate |
| 20: | color modulating section |
| 30: | black mask |
| 40: | planarizing layer |
| 50: | passivation layer |
| 60: | transparent electrode |
| 70: | shadow mask |
| 80: | organic EL layer |
| 90: | reflective electrode |
| 100: | external light |
| 150: | reflected light |
| 600: | variable display section |
| 650: | segment display section |

What is claimed is:

1. An organic EL panel comprising:
a substrate; and
a segment display section provided on the substrate and comprising an organic EL light emitting section and plural kinds of color modulating sections;
the organic EL light emitting section comprising a single reflective electrode, an organic EL layer, a transparent and insulative shadow mask having a plurality of openings, and a single transparent electrode; and
the plural kinds of color modulating sections being arranged adjacent to the substrate, and each of the plural kinds of color modulating sections being divided into a plurality of subsections.

2. The organic EL panel according to claim 1, wherein each of the plural kinds of color modulating sections is composed of either (i) a color filter layer, or (ii) a laminated structure of a color filter layer and a color conversion layer.

3. The organic EL panel according to claim 1, wherein emitting color of the segment display section is adjusted by positions and number of the openings arranged in the shadow mask.

4. The organic EL panel according to claim 1, further comprising a variable display section comprising at least a second reflective electrode comprising a plurality of electrode elements, a second organic light emitting layer, and a second transparent electrode comprising a plurality of electrode elements.

5. The organic EL panel according to claim 1, wherein the plural kinds of color modulating sections are so provided that the kinds and proportion thereof allow emission of white light.

6. The organic EL panel according to claim 1, wherein the plural kinds of color modulating sections comprise a red color modulating section, a green color modulating section, and a blue color modulating section.

* * * * *